(12) United States Patent
Tung et al.

(10) Patent No.: US 12,389,617 B2
(45) Date of Patent: Aug. 12, 2025

(54) SEMICONDUCTOR DEVICE AND METHOD OF FABRICATING THE SAME

(71) Applicant: Fujian Jinhua Integrated Circuit Co., Ltd., Quanzhou (CN)

(72) Inventors: Yu-Cheng Tung, Quanzhou (CN); Janbo Zhang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 616 days.

(21) Appl. No.: 17/706,630

(22) Filed: Mar. 29, 2022

(65) Prior Publication Data

US 2023/0163201 A1 May 25, 2023

(30) Foreign Application Priority Data

Nov. 24, 2021 (CN) .......................... 202111404609.1
Nov. 24, 2021 (CN) .......................... 202122906026.0

(51) Int. Cl.
| | |
|---|---|
| *H10D 30/01* | (2025.01) |
| *H10D 30/62* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 30/024* (2025.01); *H10D 30/6211* (2025.01); *H10D 84/0151* (2025.01); *H10D 84/0158* (2025.01); *H10D 84/038* (2025.01); *H10D 84/834* (2025.01)

(58) Field of Classification Search
CPC .......... H01L 29/66795; H01L 29/7851; H01L 27/0886; H01L 21/823431; H01L 21/823481
See application file for complete search history.

(56) References Cited

U.S. PATENT DOCUMENTS

| | | | |
|---|---|---|---|
| 9,985,023 B1 * | 5/2018 | Liu ..................... | H01L 23/5283 |
| 2011/0298058 A1 * | 12/2011 | Kawasaki ............ | H10D 30/024 |
| | | | 257/E27.059 |
| 2014/0264279 A1 * | 9/2014 | Cheng ............... | H01L 29/78696 |
| | | | 977/890 |
| 2015/0137181 A1 * | 5/2015 | Basker ................. | H10D 30/794 |
| | | | 257/192 |
| 2019/0273023 A1 * | 9/2019 | Loh .................... | H10D 84/0133 |

* cited by examiner

*Primary Examiner* — Mark W Tornow
(74) *Attorney, Agent, or Firm* — Winston Hsu

(57) ABSTRACT

The present disclosure provides a semiconductor device and a method of fabricating the same, and the semiconductor device includes a substrate, active areas, and an isolation structure. The active areas are parallel and separately disposed with each other in the substrate, and each of the active areas includes an active fin and active ends disposed at two sides of the active fin. The active fin and the active ends include different materials. The isolation structure is disposed in the substrate to surround the active areas. With this arrangement, the extending area of the active areas may be improved, so as to make sure the storage node contacts formed subsequently may directly and stably contact with the active areas.

9 Claims, 8 Drawing Sheets

SEMICONDUCTOR DEVICE AND METHOD OF FABRICATING THE SAME

BACKGROUND OF THE INVENTION

1. Field of the Invention

The present disclosure generally relates to a semiconductor device and a method of fabricating the same, and more particularly, to a semiconductor device having active areas and shallow trench isolations and a method of fabricating the same.

2. Description of the Prior Art

With the miniaturization of semiconductor devices and the complexity of integrated circuits, the size of elements is continuously shrinking and the structure is constantly changing. Therefore, maintaining the performance of small-sized semiconductor elements is the standard purpose of the present industry. In the semiconductor fabricating process, most of the active areas are defined on the substrate as a bass element, and then, the required elements are further formed on the active areas. Generally, the active areas are plural patterns formed within the substrate through the photolithography and etching processes. However, due to the sized-shrinking requirements, the width of the active areas has been gradually reduced, and the pitch between the active areas has also been gradually reduced thereby, so that, the fabricating process of active areas encounters plenty limitations and challenges that fails to meet the practical product requirements.

SUMMARY OF THE INVENTION

One of the objectives of the present disclosure provides a semiconductor device and a method of fabricating the same, in which the active areas thereof includes active fins and active ends disposed at two sides of each active fin and including different materials. With these arrangements, the semiconductor device of the present disclosure enables to enlarge the extending area of the active areas, thereby making surface the storage node contacts (SNC) being directly and stably contacted with the active areas. In this way, the structure of the storage node contacts may have improved structural stability, so as to achieve better device performance.

To achieve the purpose described above, one embodiment of the present disclosure provides a semiconductor device including a substrate, active areas, and an isolation structure. The active areas are parallel and separately disposed with each other in the substrate, and each of the active areas includes an active fin and active ends disposed at two sides of the active fin. The active fin and the active ends include different materials. The isolation structure is disposed in the substrate to surround the active areas.

To achieve the purpose described above, one embodiment of the present disclosure provides a method of fabricating a semiconductor device including the following steps. Firstly, a substrate is provided. Then, a plurality of active areas and an isolation structure are formed in the substrate, the isolation structure surrounds the active areas, wherein each of the active areas includes an active fin and active ends disposed at two sides of the active fin, and the active fin and the active ends include different materials.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic diagrams illustrating a fabricating method of a semiconductor device according to a first embodiment in the present disclosure, wherein:

FIG. 1 is a schematic top view of a semiconductor device after forming active area units in the present disclosure;

FIG. 2 is a schematic cross-sectional view taken along a cross-line A-A' in FIG. 1;

FIG. 3 is a schematic top view of a semiconductor device after forming openings in the present disclosure;

FIG. 4 is a schematic cross-sectional view taken along a cross-line A-A' in FIG. 3;

FIG. 5 is a schematic cross-sectional view of a semiconductor device after performing an epitaxial growing process in the present disclosure;

FIG. 6 is a schematic top view of a semiconductor device after forming an insulating layer in the present disclosure; and FIG. 7 is a schematic cross-sectional view taken along a cross-line A-A' in FIG. 6.

FIG. 11 to FIG. 12 are schematic diagrams illustrating a fabricating method of a semiconductor device according to a second embodiment in the present disclosure, wherein:

FIG. 11 is a schematic cross-sectional view of a semiconductor device after forming an insulating layer in the present disclosure; and FIG. 12 is a schematic cross-sectional view of a semiconductor device after performing an etching process in the present disclosure.

FIG. 13 to FIG. 15 are schematic diagrams illustrating a fabricating method of a semiconductor device according to a third embodiment in the present disclosure, wherein:

FIG. 13 is a schematic top view of a semiconductor device after forming active area units in the present disclosure;

FIG. 14 is a schematic cross-sectional view taken along a cross-line A-A' in FIG. 13; and FIG. 15 is a schematic cross-sectional view of a semiconductor device after performing an epitaxial growing process in the present disclosure.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
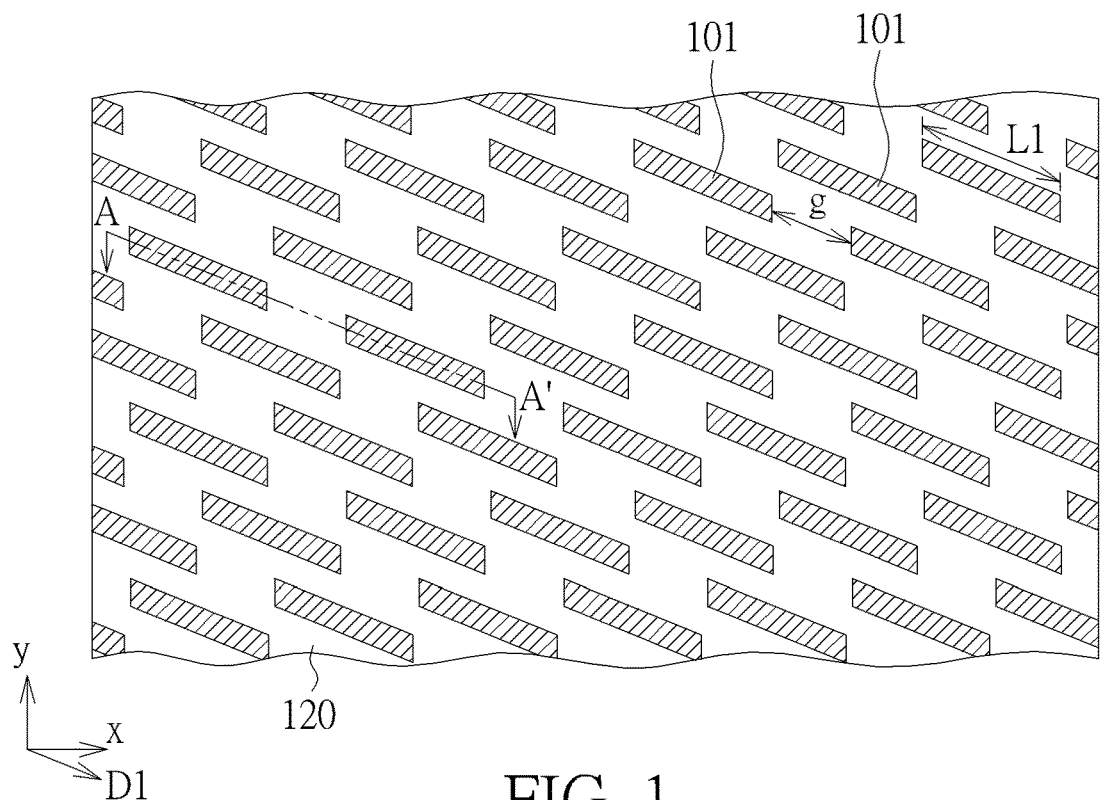
Figure 2:
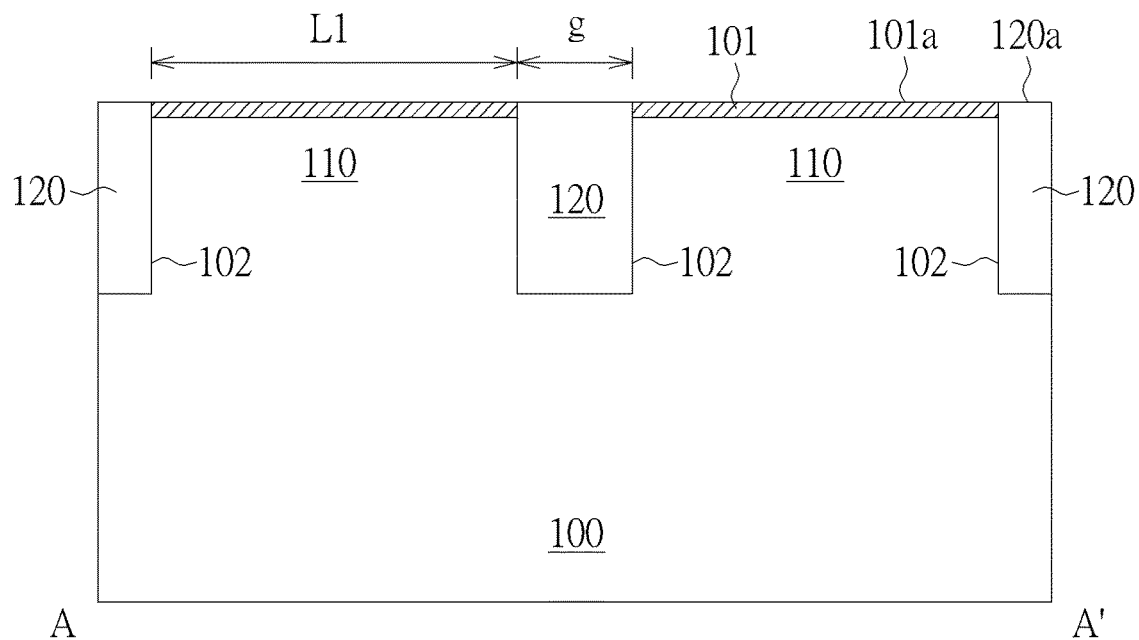
Figure 3:
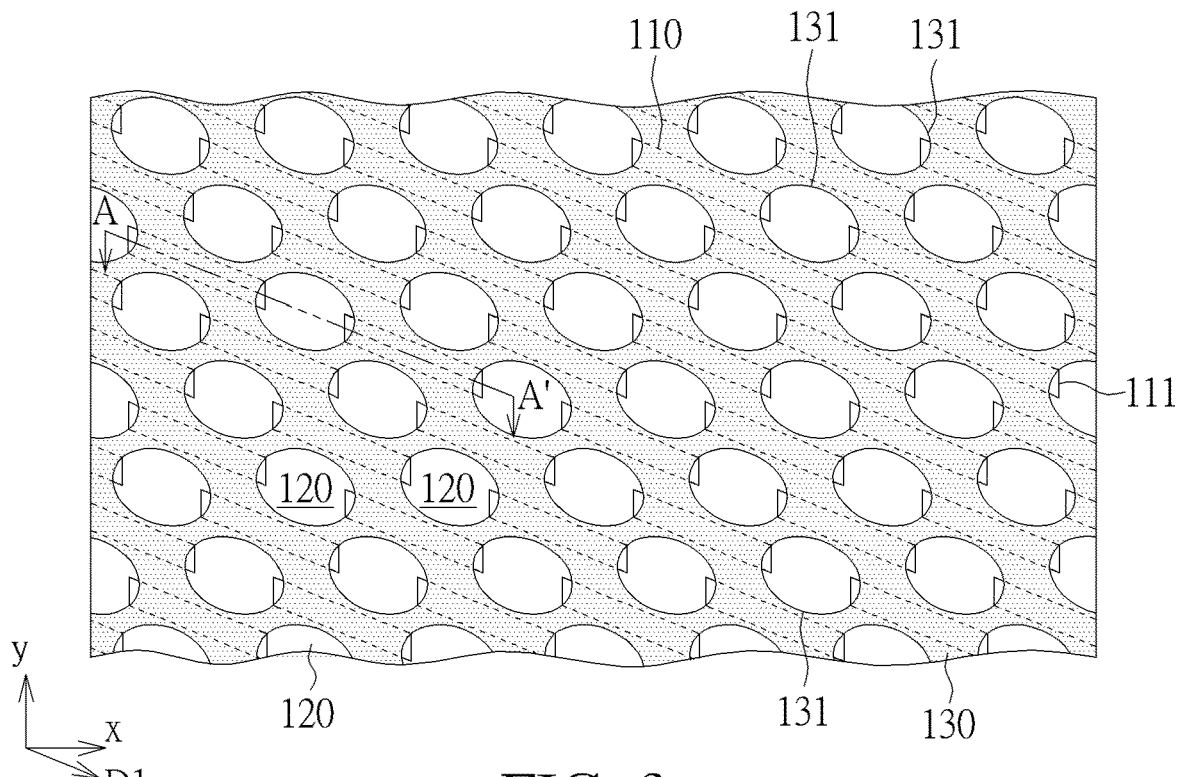
Figure 4:
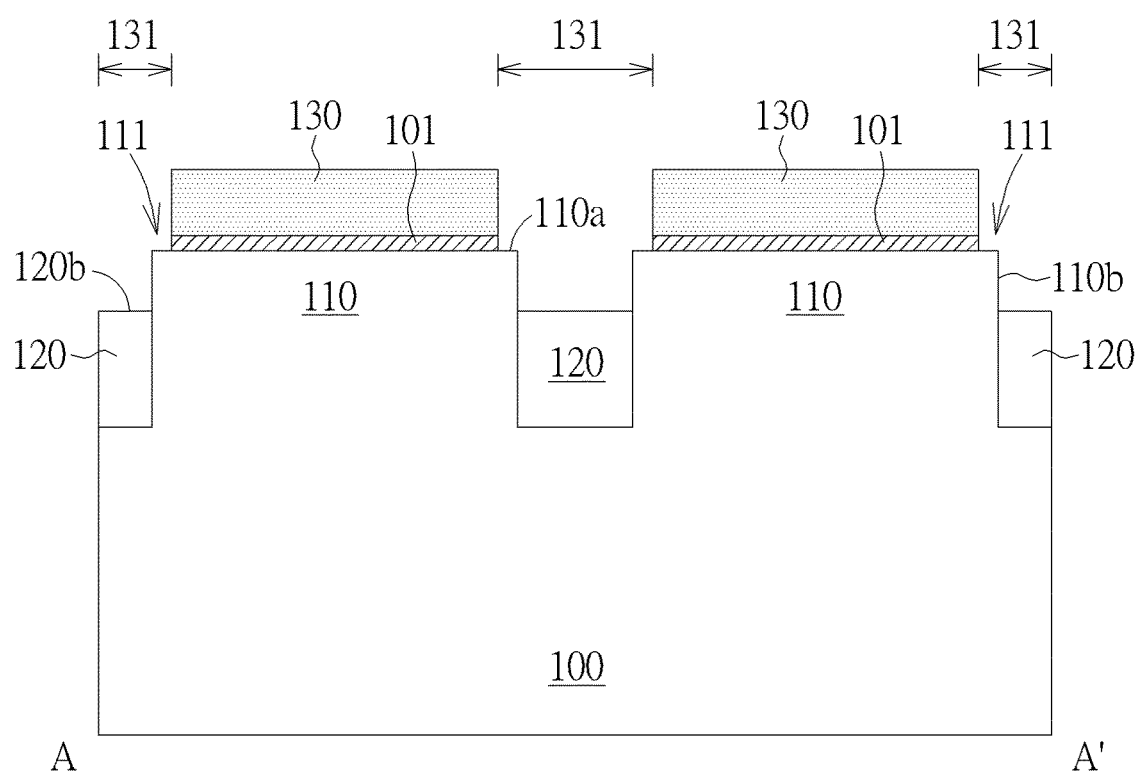
Figure 5:
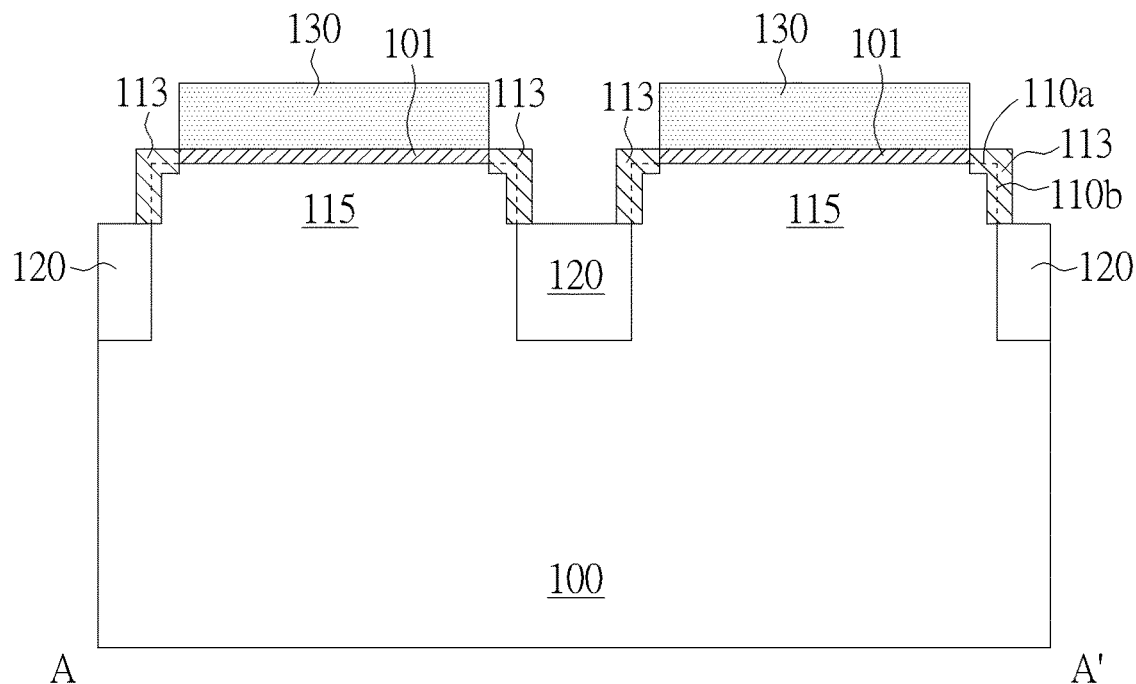
Figure 6:
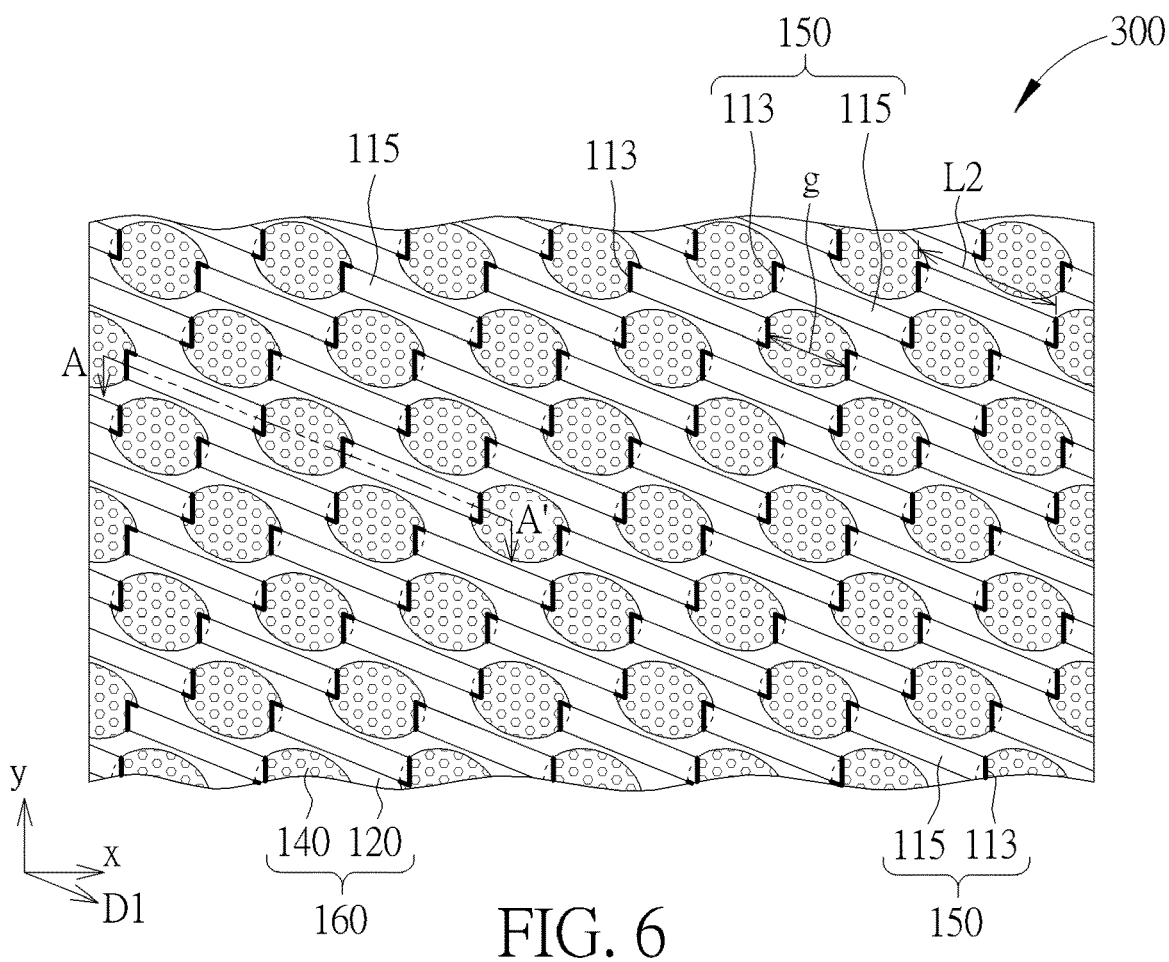

Please refer to FIGS. 1-7, which are schematic diagrams illustrating a fabricating method of a semiconductor device 300 according to the first embodiment in the present disclosure, with FIGS. 1, 3, and 6 respectively illustrating a top view of the semiconductor device 300 during various forming processes, with FIGS. 2, 4, 5, and 7 respectively illustrating a cross-sectional view of the semiconductor device 300 during various forming processes. Firstly, a substrate 100 is provided, the substrate 100 for example includes a silicon substrate, a silicon containing substrate (such as SiC or SiGe), or a silicon-on-insulator (SOI) substrate, and a first insulating layer 120 is disposed in the substrate 100, to define a plurality of active area units 110 in the substrate 100. The active area units 110 are parallel and separately extended along a direction D1, and which are alternately arranged with each other, wherein the direction D1 is for example intersected with and not perpendicular to the y-direction or the x-direction, as shown in FIG. 1. In one embodiment, each of the active area units 110 may have the same length L1 in the direction D1, and adjacent ones of the active area units 110 may have the same gap "g" therebetween.

In one embodiment, the formation of the active area units 110 may but not limited be accomplished by the following patterning process. For example, a mask layer (not shown in the drawings) may be firstly formed on the substrate 100, with the mask layer including a plurality of mask patterns 101 for defining the active area units 110 and with a portion of the substrate 100 being exposed form the mask layer, an etching process is then performed by using the mask layer, to remove the portion of the substrate 100 and to form at least one shallow trench 102, and an insulating material (not shown in the drawings) for example including silicon oxide ($SiO_x$), silicon nitride (SiN) or silicon oxiynitride (SiON) is formed to fill in the shallow trench 102, to form the first insulating layer 120 with a coplanar surface 120a with the top surface 101a of the mask layer, and to define the active area units 110 simultaneously, as shown in FIG. 1 and FIG. 2. In one embodiment, the formation of the active area units 110 may also be accomplished by a self-aligned double patterning (SADP) process or a self-aligned reverse patterning (SARP) process, but not limited thereto.

Please refer to FIGS. 3-4, a mask layer 130 is formed on the substrate 100 while the mask patterns 101 are still remained on the substrate. The mask layer 130 includes a plurality of openings 131, the openings 131 are respectively in alignment with the gap "g" disposed between adjacent ones of the active area units 110, to expose the first insulating layer 120 and end potions 111 of the active area units 110 underneath. The end portions 111 for example refer to the side edges of each active area unit 110 extending in the y-direction in a top view as shown in FIG. 3. In the present embodiment, the end portions 111 at least includes the side edges of each active area unit 110 extending in the y-direction, and a portion of at least one side edge extending in the direction D1 and adjacent to the side edges of each active area unit 110 extending in the y-direction, as shown in FIG. 3. Then, an etching process is performed through the mask layer 130, to remove the mask patterns 101 remained on the end portions 111 of the active area units 110 thereby exposing partial top surface 110a of the active area units 110, and to partially remove the exposed portions of the first insulating layer 120, with the portions of the first insulating layer 120 obtaining a top surface 120b lower than the top surface 110a of the active area units 110 after the etching process, as shown in FIG. 4. Accordingly, the top surfaces 110a and partial sidewalls 110b of the end portions 111 of each active area unit 110 may be exposed after performing the etching process.

Please refer to FIG. 5, a selectively epitaxial growing process is performed while the mask layer 130 and the mask patterns 101 are still remained on the substrate 100, to form active ends 113. Please also refer to FIGS. 5-6, in the present embodiment, the active ends 113 are formed on the side edges extending in the y-direction of each active area unit 110, and the portion of the at least one side edge extending in the direction D1 and adjacent to the side edges extending in the y-direction, thereby presenting in an L-shape as being viewed from a top view as shown in FIG. 6. In addition, the active ends 113 are formed on the exposed top surface 110a and partial sidewalls 110b of the end portions 111 of each active area unit 110, thereby also presenting in an L-shape as being viewed from a cross-sectional view as shown in FIG. 5, but not limited thereto. On the other hand, the rest portions of each active area unit 110 without epitaxial growing form an active fin 115, so that, the active ends 115 and the active fin 115 together form an active area 150, and a plurality of the active areas 150 is formed in the substrate 100. It is noted that, the active ends 113 for example include an epitaxial material which is different from that of the substrate 100. For example, while the substrate 100 includes a silicon substrate, the active ends 113 may include silicon germanium (SiGe), but is not limited thereto. Then, the mask layer 130 and the mask patterns 101 are completely removed.

Figure 7:
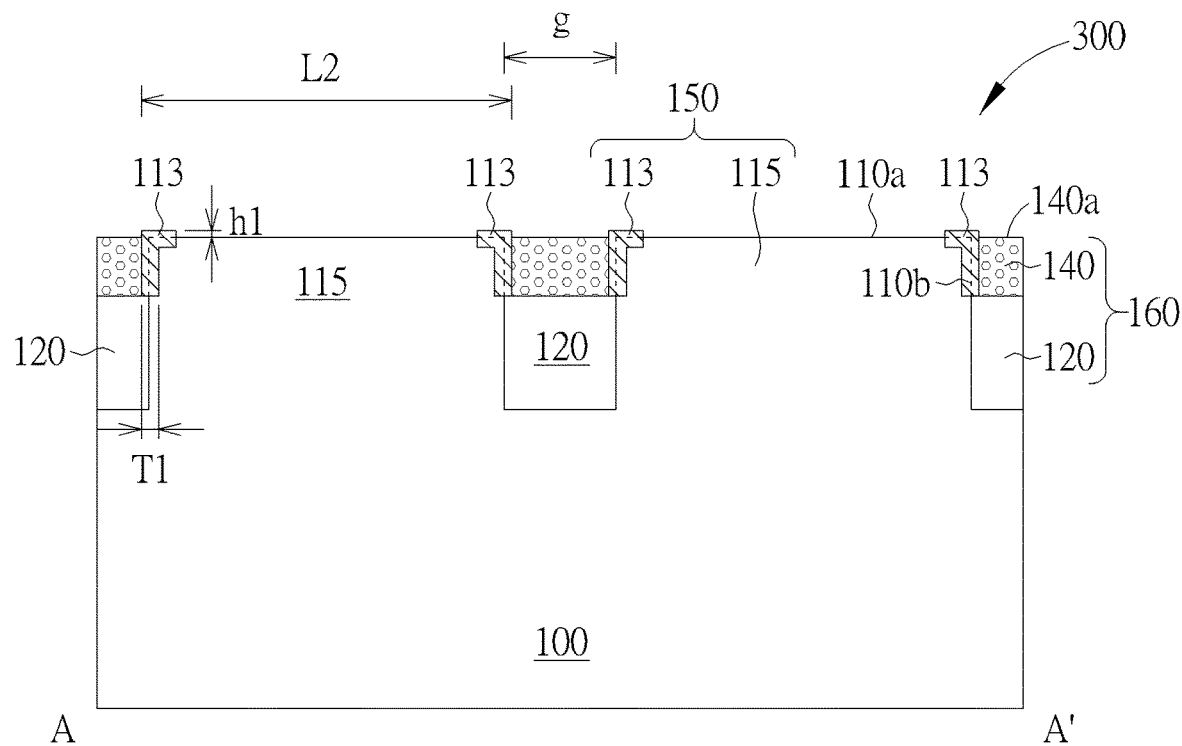

Please refer to FIGS. 6-7, a second insulating layer 140 is formed on the portion of the first insulating layer 120, so that, the top surface 140a of the second insulating layer 140 may be coplanar with the top surface (namely, the top surface 110a) of the active fins 115, as shown in FIG. 7. Accordingly, the first insulating layer 120 and the second insulating layer 140 may together form an isolation structure 160 in the substrate 100, to surround the active areas 150, wherein the second insulating layer 140 is disposed between adjacent ones of the active areas 150, thereby being surrounded by the first insulating layer 120, as shown in FIG. 6. With these arrangements, the isolation structure 160 may further isolate the adjacent ones of the active areas 150, to achieve better isolation. Also, the top surface of the active ends 113 may be slightly higher than the top surface of the active fins 115 and the top surface 140a of the second insulating layer 140, to obtain an obvious height difference h1 therebetween, as shown in FIG. 7. On the other hand, the active ends 113 may also include a different roughness from that of the substrate 100(namely, active fins 115). For example, while the substrate 100 includes a silicon substrate to have a relative smaller roughness, the active ends 113 (for example including silicon germanium) may include a relative greater roughness. However, the practical roughness of the substrate 100 and the active ends 113 may be diverse by material difference, and which is not limited to above mentioned.

Through the aforementioned processes, the semiconductor device 300 of the first embodiment in the preset disclosure is completed. The semiconductor device 300 for example includes a plurality of the active areas 150 and the isolation structure 160 surrounding the active areas 150. The active area 150 includes the active fins 115 and the active ends 113 disposed at two sides of the active fin 115, with the active ends 113 having a different material from that of the active fin 115, so as to obtain an enlarge length L2 in the direction D1. Accordingly, while forming other elements on the active areas 150 in the subsequent processes, the enlarge length and the epitaxial material achieved by the active ends 113 may provide better electrically connection and more stable contact therebetween.

Figure 8:
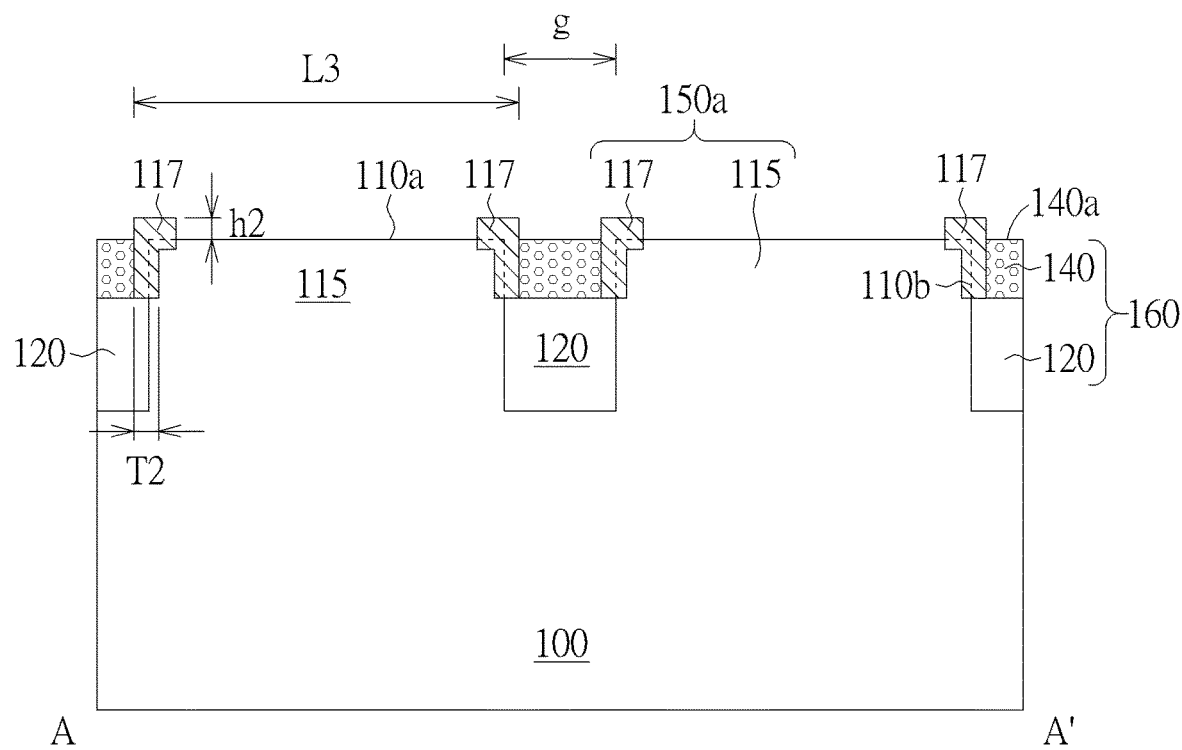
FIG. 8 is a schematic diagram illustrating a semiconductor device performing an epitaxial growing process according to another preferable embodiment in the present disclosure.
Figure 9:
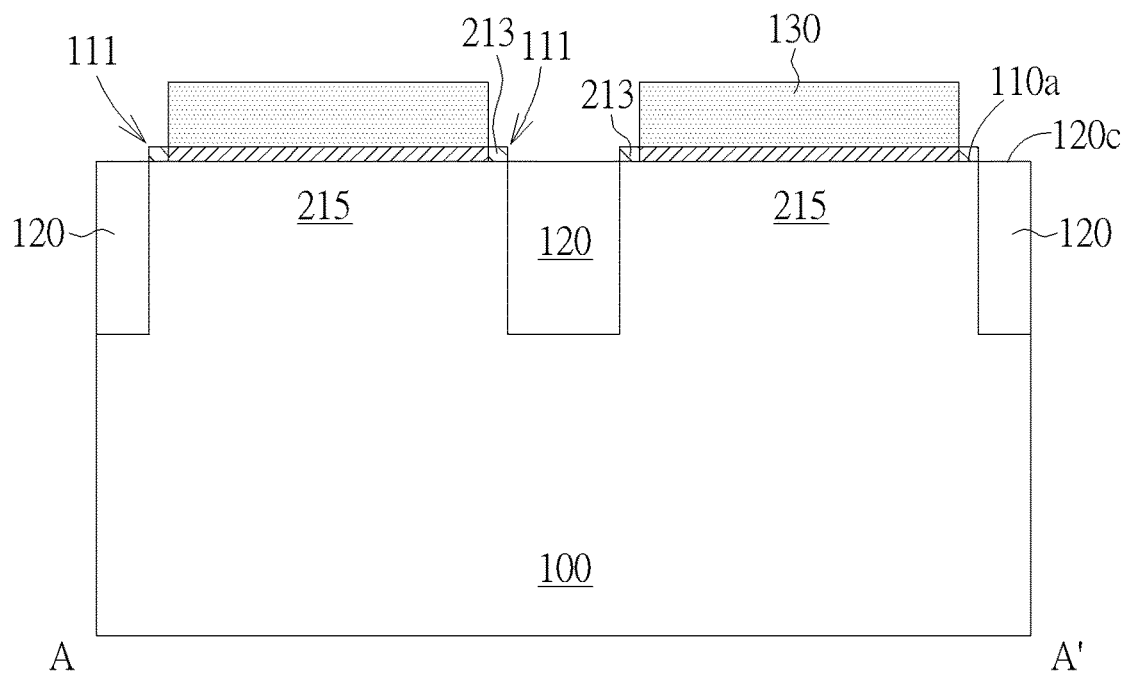
FIG. 9 is a schematic diagram illustrating a semiconductor device after performing an epitaxial growing process according to another preferable embodiment in the present disclosure.

However, people in the art should fully realize that the semiconductor device and the fabricating method thereof are not be limited to the aforementioned embodiment and may include other examples or may be achieved through other strategies to meet practical product requirements. For example, in one embodiment, while performing the selectively epitaxial growing process, active ends 117 having a relative greater thickness may be formed by increasing the growing area of the epitaxial materials. Then, the top surface of the active ends 117 may be obviously higher than the top surface (namely, the top surface 110a) of the active fins 115 and the top surface 140a of the second insulating layer 140, thereby obtaining a relative greater height difference h2, as shown in FIG. 8. With these arrangements, the active areas 150a (including the active ends 117 and the active fins 115) may include an enlarged length L3 in the direction D1, and also, the height difference h2 between the active fins 115 and the active ends 117 may also be further increased to enlarge the contact area between the active areas 150a and the storage node contacts, thereby obtaining a more reliable structure. Otherwise, in another embodiment, while performing the etching process through the mask layer 130, the mask patterns 101 remained on the end portions 111 of the active units 110 may be removed, and the exposed first insulating layer 120 may also be partially removed, to only expose the top surface of the end portions 111 of the active area units 110. Namely, after the etching process, a top surface 120c of a portion of the first insulating layer 120 may be coplanar with the top surface 110a of the active area units 110, without exposing the sidewalls 110b of the end portions 111 of the active area units 110, as shown in FIG. 9. Through these arrangements, active ends 213 may be formed only on the top surface 110a of the end portions 111 of the active area units 110 in the selectively epitaxial growing process performed subsequently, thereby obtaining a linear shape in a cross-sectional view, as shown in FIG. 9. Thus, through the arrangements in aforementioned two embodiments may also improve the extending area of the active areas, to ensure the directly and stably connection between the active areas and the storage node contacts.

People in the art should fully realize that the semiconductor device and the fabricating method thereof may include other examples or may be achieved through other strategies to meet practical product requirements. The following description will detail the different embodiments of the semiconductor device and the fabricating method thereof. To simplify the description, the following description will detail the dissimilarities among the different embodiments and the identical features will not be redundantly described. In order to compare the differences between the embodiments easily, the identical components in each of the following embodiments are marked with identical symbols.

Figure 10:
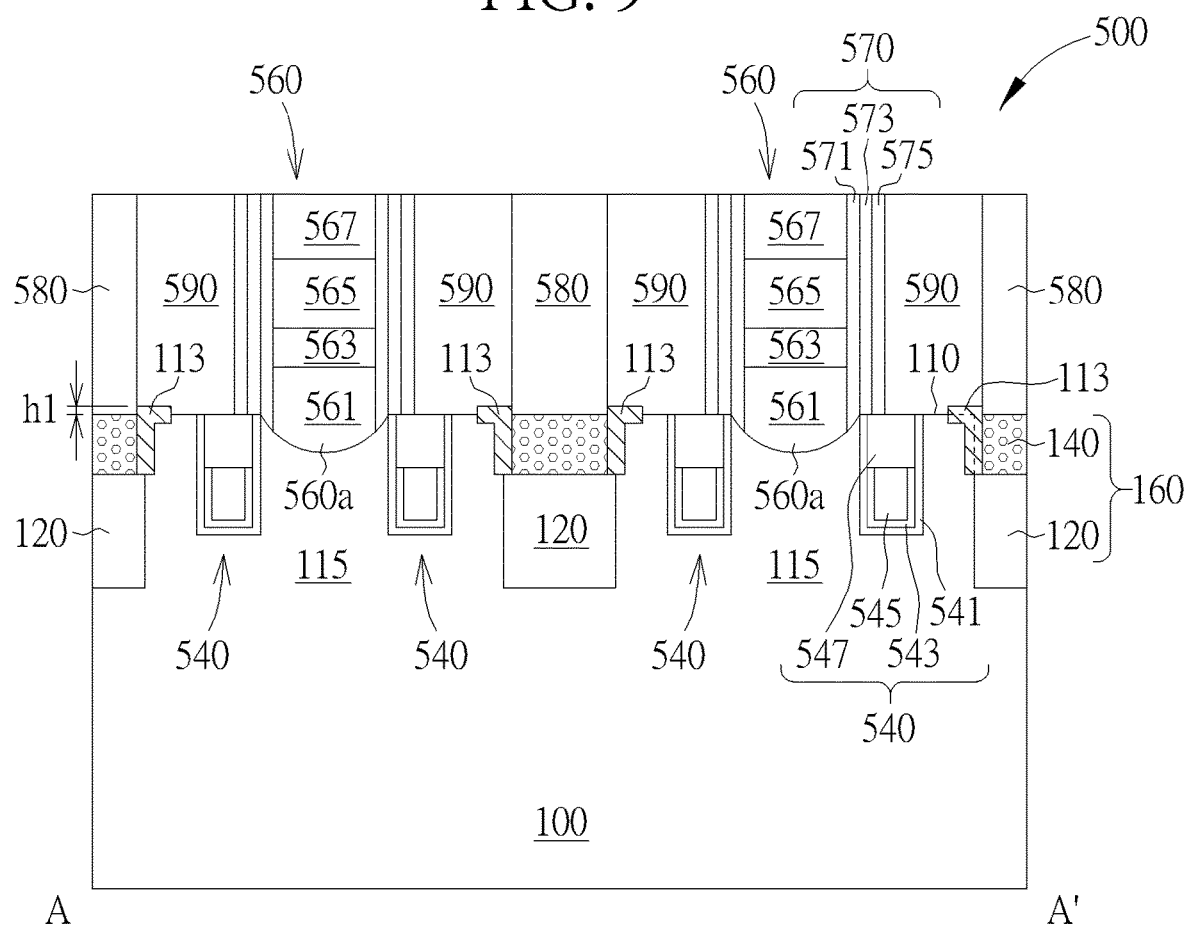
FIG. 10 is a schematic diagram illustrating a semiconductor device according to one preferable embodiment in the present disclosure.

Please refer to FIG. 10, which illustrate a schematic diagram of a semiconductor device 500 according to a preferable embodiment in the present disclosure. The structure of the semiconductor device 500 in the present embodiment is substantially the same as the semiconductor device 300 in the aforementioned first embodiment, including the substrate 100, the active areas 150 (including the active fins 115 and the active ends 113), and the isolation structure 160 (including the first insulating layer 120 and the second insulating layer 140), and which will not be redundantly described hereinafter. The difference between the present embodiment and the aforementioned first embodiment is in that the semiconductor device 500 additionally includes a plurality of first wires 540 formed in the substrate 100, and a plurality of second wires 560 and a plurality of plugs 590 formed on the substrate 100.

Precisely speaking, the first wires 540 for example are parallel extended along the y-direction, to intersect with the active areas 150 and to pass through the first insulating layer 120 and the second insulating layer 140 at the same time. In one embodiment, a plurality of trenches (not shown in the drawings) which are parallel and separately extended along the y-direction are firstly formed in the substrate 100. Then, an interface dielectric layer 541 entirely covering surfaces of each of the trenches, a gate dielectric layer 543 covering bottom surfaces of each of the trenches, a gate electrode layer 545 filling up the bottom of each of the trenches, and a mask layer 547 filling up the top of each of the trenches, are sequentially formed in the trenches. Accordingly, the topmost surface of the mask layer 547 may be coplanar with the top surface (the top surface 110a) of the active fins 115, as shown in FIG. 10, so that, each of the first wires 540 embedded in the substrate 100 may therefore function like a buried word line (WL) of the semiconductor device 500, with each word line (namely the first wire 540) across the active fins 115 of active areas 150 for receiving or transmitting voltage signals from each memory cell (not shown in the drawings). Although the extending directions of the trenches or the first wires 540 are not precisely illustrated in the drawings, people well skilled in the arts should fully realize the first wires 540 extended in the y-direction may intersect with the active areas 150 to pass through the isolation structure 160 (including the first insulating layer 120 and the second insulating layer 140) from a top view.

On the other hand, the second wires 560 are for example parallel extended along the x-direction, to intersect with the active areas 150, and being perpendicular with the first wires 540 in a projection direction (not shown in the drawings). The second wires 560 and the plugs 590 are alternately arranged with each other on a dielectric layer 580 disposed on the substrate 100, and the adjacent ones of the plugs 590 and the second wires 560 are isolated from each other by a spacer 570 disposed therebetween, as shown in FIG. 10. In one embodiment, the spacer 570 for example includes a first spacer 570 (including a material like silicon nitride), a second spacer 573 (including a material like silicon oxide), and a third spacer 575 (for example including a material like silicon nitride), but is not limited thereto. Each of the second wires 560 for example includes a semiconductor layer (for example including polysilicon) 561, a barrier layer 563 (for example including titanium and/or titanium nitride), a conductive layer 565 (for example including a low-resistant metal like tungsten, aluminum, or copper), and a capping layer 567 (for example including silicon oxide, silicon nitride, or silicon oxynitride), but is not limited thereto. It is noted that, a plurality of contacts (bit line contacts, BLC) 560a may be formed under the second wires 560, to further extend into the active fins 115 in the substrate 100, between two adjacent ones of the first wires 540, and also between two adjacent ones of active ends 113. In the present embodiment, the contacts 560a and the semiconductor layer 561 of the second wires 560 are monolithic, to directly contact the active fins 115, but not limited thereto. The plugs 590 are directly in contact with the active fins 115, the active ends 113, and a portion of the capping layer 547 of the first wires 540, thereby obtaining a more stably structure of the storage node contact (SNC). It is also noted that, while the thickness of the active ends 113 is obviously greater than that of the active fins 115, the bottom surface of the plugs 590 may also obtain the corresponding height difference h1. Then, the structure of the plugs 590 may become more reliable.

Through the aforementioned arrangements, the semiconductor device 500 accordingly to the present embodiment may be configured as a dynamic random access memory (DRAM) device, and which may include at least one transistor (not shown in the drawings) and at least one capacitor (not shown in the drawings) to serve as the smallest memory cell of the DRAM array to receive the voltage signals from the second wires (namely, the bit lines) 560 and the first wires (namely, the word lines) 540. The active areas 150 of the semiconductor device 500 also include the active fins 115 and the active ends 113 disposed at two sides of each active fin 115 and having a different material from that of the active fins 115, so that, the plugs 590 may be stably disposed on the active fins 115, active ends 113, and the boundary therebetween. Accordingly, the plugs 590 may obtain a stable and reliable structure to achieve better electrically connection. In this way, the semiconductor device 500 of the present embodiment may therefore have improved structure and better functions.

Figure 11:
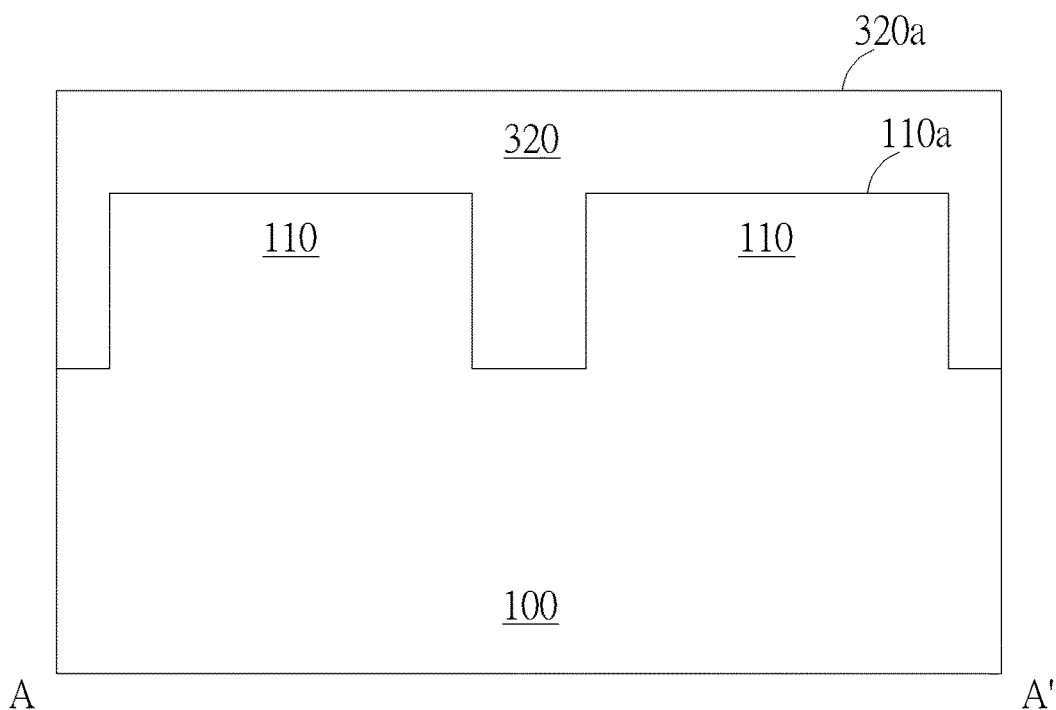
Figure 12:
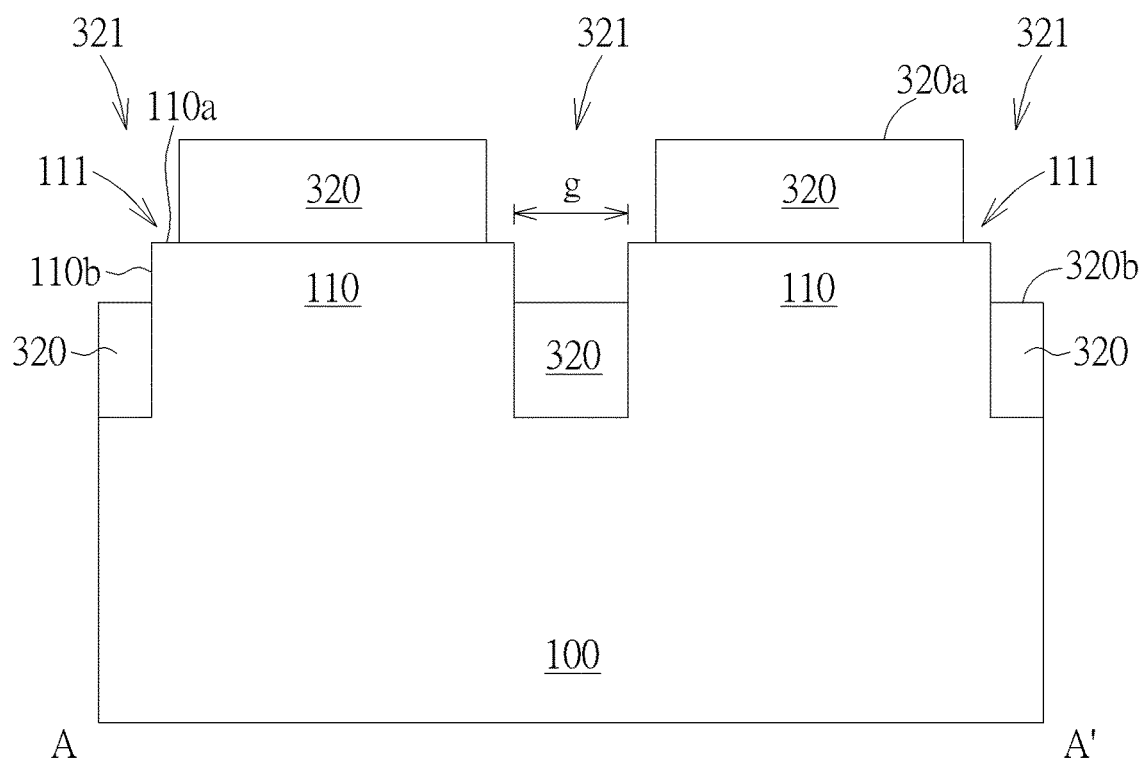

Please refer to FIGS. 11-12, which illustrate schematic diagrams of a fabricating method of a semiconductor device according to a second embodiment in the present disclosure. The fabricating processes of the semiconductor device in the present embodiment is substantially the same as those in the aforementioned first embodiment, and all the similarities will not be redundantly described hereinafter. The difference between the fabricating method in the present embodiment and the aforementioned first embodiment is in that an insulating layer 320 is directly used as a mask layer in the present embodiment, to sequentially perform an etching process and a selectively epitaxial growing process.

Precisely speaking, after defining a plurality of active area units 110 in the substrate 100, the mask patterns (not shown in FIGS. 11-12) are removed, and then, the insulating layer 320 is formed to surround the active area units 110. In other words, a top surface 320a of the insulating layer 320 may be higher than the top surface 110a of the active area units 110, as shown in FIG. 11.

Next, a mask layer (not shown in the drawings) is formed on the substrate 100, and which includes a plurality of openings (not shown in the drawings) in alignment with the gaps "g" between the adjacent ones of the active area units 110 respectively. Through the mask layer to perform the etching process, a plurality of openings 321 is formed in the insulating layer 320, to expose the top surface 110a and the sidewalls 110b of the end portions 111 of each active area unit 110, as shown in FIG. 12. Following these, as being performed in FIGS. 5-7 in the aforementioned first embodiment, the selectively epitaxial growing process is performed while the insulating layer 320 being remained on the substrate 100, so as to form the active ends 113 as shown in FIGS. 6-7, or to form the active ends 117 as shown in FIG. 8, but not limited thereto. Then, an planarization process (not shown in the drawings) is performed, to remove the insulating layer 320 disposed on the active area units 110, so that, the insulating layer 320 may obtain a top surface 320b lower than the top surface 110a of the active area units 110, to surround the active area units 110 to serve as the isolation structure. In this way, the active ends 113 or the active ends 117 may be formed in the present embodiment to improve the extending area of the active area, so as to enable the directly and stably connection between the storage node contacts and the active areas.

Figure 13:
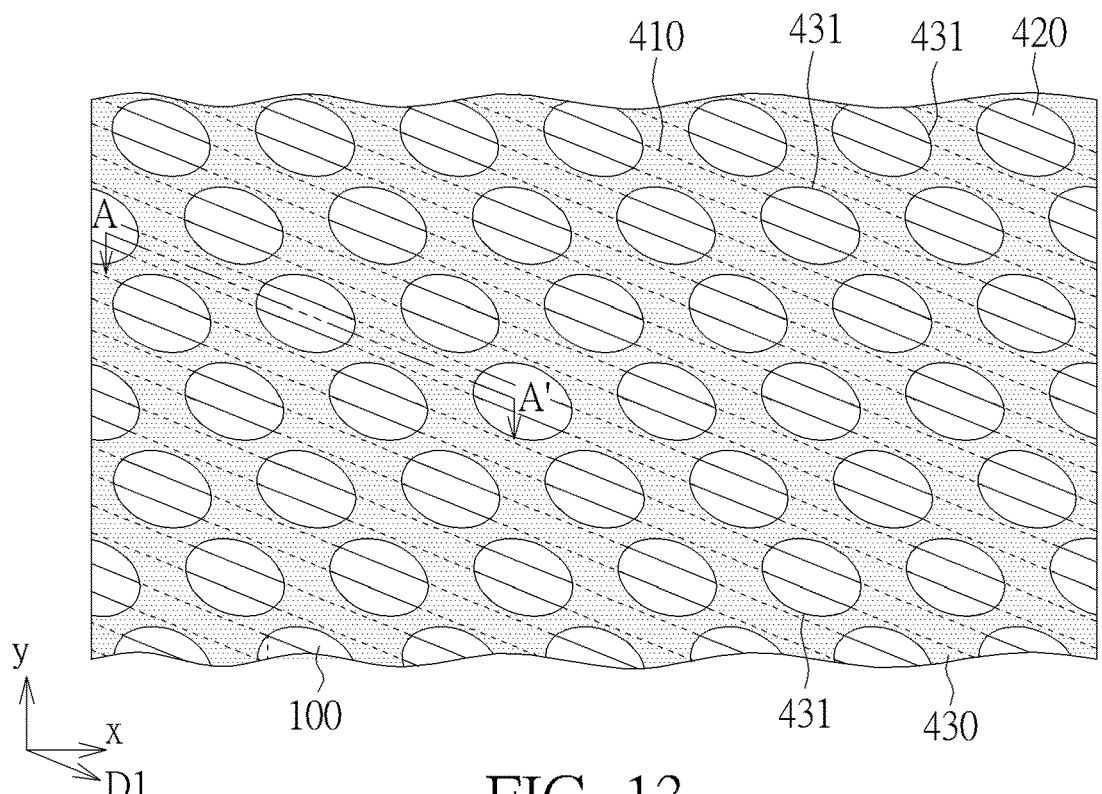
Figure 14:
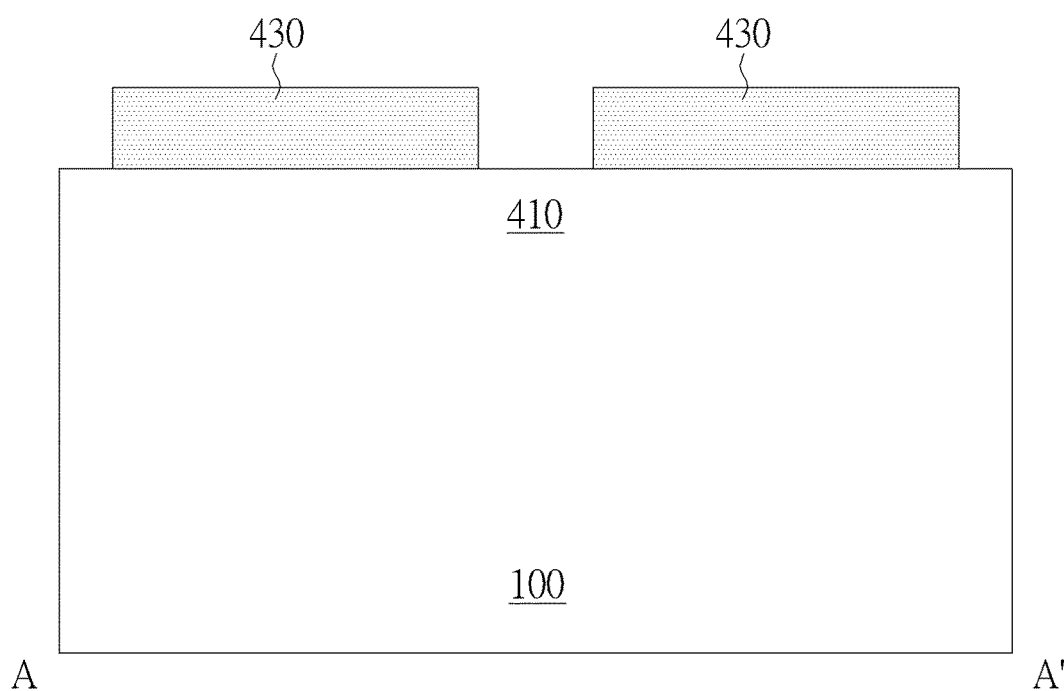
Figure 15:
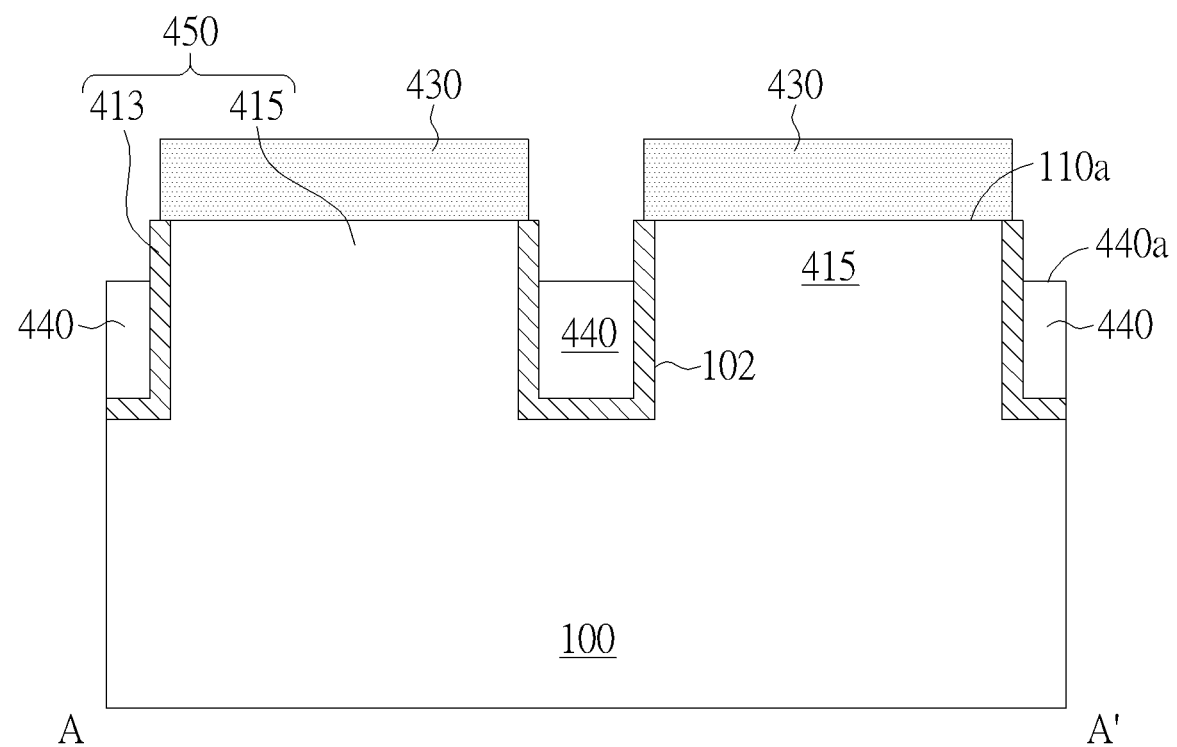

Please refer to FIGS. 13-15, which illustrate schematic diagrams of a fabricating method of a semiconductor device according to a third embodiment in the present disclosure. The fabricating processes of the semiconductor device in the present embodiment is substantially the same as those in the aforementioned first embodiment, and all the similarities will not be redundantly described hereinafter. The difference between the fabricating method in the present embodiment and the aforementioned first embodiment is in that a plurality of active area fragments 410 is formed through the SADP.

Precisely speaking, as shown in FIGS. 13-14, the active area fragments 410 are formed in the substrate 100 through the SADP or the SARP process, with each of the active area fragments 410 being parallel extended along the direction D1 and being surrounded by a first insulating layer 420. Next, a mask layer 430 is formed on the substrate 100, and which includes a plurality of openings 431 to partially expose the active area fragments 410 underneath. Then, an etching process is performed through the mask layer 430, to partially remove each of the active area fragments 410 which are exposed from each of the openings 431, to form shallow trenches 102 in the substrate 100. Accordingly, each of the active area fragments 410 may be cut into a plurality of active area units 110 as shown in FIG. 1. In addition, after the etching process is performed, another etching process such a wet etching process may be performed then to partially remove the first insulating layer 420 disposed around the active area units 110, especially the first insulating layer 420 closed to the end portions 111 of each active area units 110, thereby forming the semiconductor device as shown in FIG. 3

After that, a selectively epitaxial growing process is performed while the mask layer 430 is remained on the substrate 100, to form active ends 413 at two sides of each of the active area units 110. Then, the rest portion of each of the active area units 110 form the active fins 415, and the active ends 413 and the active fins 415 together form the active areas 450, as shown in FIG. 15. It is noted that, in the present embodiment, each of the active ends 413 may be formed on the side edges extending in the y-direction, and on the portion of the at least one side edge extending in the direction D1 and being adjacent to the side edges extending in the y-direction, thereby presenting in an L-shape as being viewed from a top view (not shown in the drawings but being similar to the top view as shown in FIG. 6). On the other hand, each of the active ends 413 is formed on the exposed surfaces at two sides of each active area units 110 (namely, including the sidewalls and the bottle walls of the shallow trenches 102 as shown in FIG. 15), thereby presenting in an U-shape as being viewed from a cross-sectional view as shown in FIG. 15. Then, after forming the active ends 413, a second insulating layer 440 is formed in the shallow trenches 102, and the second insulating layer 440 may include a top surface 440a lower than the top surface 110a of the active area units 110, as shown in FIG. 15. Otherwise, in another embodiment, the second insulating layer may optionally include a top surface being coplanar with the top surface 110a of the active area units 110. Accordingly, the remain portion of the first insulating layer 420 and the second insulating layer 440 may together form the isolation structure in the present embodiment. Through the aforementioned arrangements, the active ends 413 may also formed through the fabricating processes in the present embodiment, and which may improve the extending area of the active areas 450, so as to enable the directly and stably connection between the storage node contacts and the active areas.

Overall speaking, the semiconductor device of the present disclosure includes the active areas having composite materials. The active areas include the active fins and the active ends disposed at two sides of each active fin and having a different material from that of the active fins. The active ends is formed through the selectively epitaxial growing process, so that, each of the active areas may obtain an extended length thereby. In this way, the extending area of each active area is sufficiently enlarged, and the contact area between the active areas and the storage node contacts is also enlarged accordingly, so as to ensure the directly and stably connection between the active areas and the storage node contacts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising;
    a substrate;
    a plurality of active areas, separately with each other in the substrate, each of the active areas comprising an active fin and active ends disposed at two sides of the active fin, and the active fin and the active ends comprising different materials;
    an isolation structure, disposed in the substrate to surround the active areas;
    a plurality of first wires, disposed in the substrate to intersect with the active areas, across the isolation structure, wherein each of the first wires comprises:
        a gate electrode layer; and
        a capping layer disposed on the gate electrode layer; and
    a plurality of plugs disposed on the substrate, wherein at least one of the plugs directly contacts the active fin and one of the two active ends of one of the active areas, and the capping layer of one of the first wires.

2. The semiconductor device according to claim 1, wherein the active fin and the active ends comprise different roughness.

3. The semiconductor device according to claim 1, wherein the active ends comprise an epitaxial material.

4. The semiconductor device according to claim 1, wherein the active ends and the active fin have a height difference therebetween.

5. The semiconductor device according to claim 1, wherein the isolation structure comprises a first insulating layer and a second insulating layer, and the second insulating layer is disposed between adjacent ones of the active areas and is surrounded by the first insulating layer.

6. The semiconductor device according to claim 1, further comprising:
    a plurality of second wires, disposed on the substrate to intersect with the active areas, the second wires directly in contact with the active fins;
    a plurality of plugs disposed on the substrate, the plugs are alternately arranged with the second wires, wherein the plugs simultaneously contact the active fins and the active ends; and
    a spacer, disposed on the substrate, between each of the second wires and each of the plugs.

7. The semiconductor device according to claim 6, wherein bottom surfaces of the plugs disposed on the active fins and the active ends comprise a height difference.

8. The semiconductor device according to claim 6, further comprising:
    a plurality of contacts, disposed under the second wires, each of the contacts being disposed between adjacent ones of the active ends.

9. A semiconductor device, comprising;
    a substrate;
    a plurality of active areas, separately with each other in the substrate, each of the active areas comprising an active fin and active ends disposed at two sides of the active fin, and the active fin and the active ends comprising different materials;
    an isolation structure, disposed in the substrate to surround the active areas; and
    a plurality of plugs, disposed on the substrate, at least one of the plugs directly in contact with the active fin and one of the two active ends of one of the active areas, a bottom plane of one of the plugs disposed on the active fin is lower than a bottom plane of the one of the plugs disposed on the one of the two active ends.

* * * * *